United States Patent [19]
Fujioka

[11] Patent Number: 6,091,290
[45] Date of Patent: Jul. 18, 2000

[54] SEMICONDUCTOR INTEGRATED CIRCUIT

[75] Inventor: Shinya Fujioka, Kawasaki, Japan

[73] Assignee: Fujitsu Limited, Kawasaki, Japan

[21] Appl. No.: 08/910,901

[22] Filed: Aug. 13, 1997

[30] Foreign Application Priority Data

Jan. 10, 1997 [JP] Japan ................................. 9-003277

[51] Int. Cl.[7] .................................................. H03K 5/08

[52] U.S. Cl. ........................ 327/589; 327/309; 327/328; 327/546; 365/189.06; 365/201; 365/203

[58] Field of Search ..................................... 327/309, 327, 327/328, 545, 546, 589; 365/189.06, 201, 203

[56] References Cited

U.S. PATENT DOCUMENTS 5,732,032  3/1998  Park et al. ............................... 365/201

Primary Examiner—Margaret R. Wambach
Attorney, Agent, or Firm—Nikaido, Marmelstein, Murray & Oram, LLP

[57] ABSTRACT

A semiconductor integrated circuit configured of a DRAM or the like has a function of generating a step-up voltage and supplying it to a plurality of semiconductor devices. During the period when a burn-in test is conducted, the input voltage of a precharge portion for precharging a step-up node for outputting the step-up voltage is clamped to a predetermined level by a precharge input voltage clamping unit. The precharge input voltage clamping unit prevents the step-up voltage level across the step-up node from excessively increasing during the burn-in test.

8 Claims, 18 Drawing Sheets

FLOATING NODE
(Vcc-Vth~Vcc+Vth)

SEMICONDUCTOR INTEGRATED CIRCUIT

BACKGROUND OF THE INVENTION

1. Field of the Invention

The present invention relates to a semiconductor integrated circuit configured of a dynamic random access memory (usually referred to as the DRAM) including semiconductor devices such as a plurality of MOS field-effect transistors (hereinafter referred to as MOS transistors or MOS FETs).

In recent years, a DRAM intended to improve the density, in which a plurality of memory cells of one-transistor/one-capacitor type each having a single nMOS transistor and a single capacitor are formed on a chip, has become available. In the case of using nMOS transistors (an abbreviation for n-channel MOS field-effect transistors) as cell transistors for writing data to the memory cells or as bit line transfer transistors for reading out data from the memory cells by a sense amplifier of shared type in order to realize a high integration of a semiconductor integrated circuit including a DRAM or the like, it is necessary to consider an influence of a threshold voltage between a gate and a source of each nMOS transistor.

In order to eliminate the influence of the threshold voltage of the nMOS transistors and stabilize the operation of writing to and reading from a plurality of the memory cells in the DRAM, a step-up voltage is generated which is higher, by at least the above-mentioned threshold level, than a source of each nMOS transistor used as a cell transistor or as a bit line transfer transistor (i.e. a step-up voltage is generated which is higher, by at least the threshold voltage, than a high voltage level of each bit line), and this step-up voltage is supplied to the gate voltage of the nMOS transistor.

The present invention refers to a method of preventing an excessive rise of the voltage level at a step-up node for producing a step-up voltage at the time of a burn-in test conducted on the semiconductor integrated circuit using such a step-up voltage.

2. Description of the Related Art

First, in order to facilitate the understanding the problems encountered when generating a step-up voltage to stabilize write and read operations for a plurality of memory cells in the DRAM constituting a semiconductor integrated circuit, the configuration and operation of a gate voltage generating portion of a cell transistor and a gate voltage generating portion of a bit line transfer transistor will be explained with reference to the accompanying drawings (FIGS. 1 to 3).

FIG. 1 is a circuit block diagram showing a configuration of a cell transistor used in an ordinary DRAM; FIG. 2 is a circuit block diagram showing a configuration a bit line transfer transistor of the DRAM; and FIG. 3 is a diagram showing an operation voltage waveform at the time of reading cell data in the DRAM. In this specification, for distinction from the peripheral circuit in the semiconductor integrated circuit, the gate voltage generating portion of the cell transistor and the gate voltage generating portion of the bit line transfer transistor in the memory block including a plurality of memories are collectively called a core circuit portion.

As shown in FIG. 1, each of the memory cells of the one-transistor/one-capacitor type currently used includes a cell transistor Tc having a nMOS transistor, and a cell capacitor Cc. In the case in which data "1" or data "0" is written in this type of memory cell through a bit line BL, it is necessary to activate (turn on) a cell transistor Tc by applying an output voltage of high voltage level to the cell transistor Tc from a word decoder 70 connected to a word line WL. Further, in order to increase the voltage change generated by stored charge Qs in the cell capacitor Cc and thus to read the data into the memory cell without any error, the gate is required is to be supplied with an input voltage sufficiently high to guarantee a stable operation of the cell transistor Tc.

In such a case, however, as shown in the operation voltage waveform diagram of FIG. 3, the voltage change across the stored charge Qs is reduced by an amount equivalent to the gate-source threshold voltage Vth of the transistor Tc. In order to obviate the effect of the threshold voltage Vth, a step-up source voltage SVii (see FIG. 1) generated by an internal step-up voltage generating unit is used to supply the word line WL with a step-up voltage higher than the source or the drain of the nMOS transistor by the above-mentioned threshold voltage or more. On the other hand, as shown in FIG. 2, assume that data is read by a shared-type senser amplifier 72 (using a reference voltage Vii) from one of two pairs of bit lines including BLX(n), BLZ(n) and BLX(n+1), BLZ(n+1). It is necessary to activate (turn on) the corresponding one of the pairs of read transistors Tx(n), Tz(n) and read transistors Tx(n+1), Tz(n+1) by a bit line transfer signal BLTX(n) or BLTX(n+1) of a step-up voltage level output from bit line transfer signal generating units 71-1, 71-2, respectively. Further, it is necessary to supply the bit line transfer signal BLTX having a voltage level sufficiently high to assure stable operation of the sense amplifier 72.

In such a case, however, in order to obviate the influence of the threshold voltage Vth and assure the read operation of data without error, the step-up voltage source SVii (see FIG. 2) is used for the bit line transfer signal generating units 71-1, 71-2 to supply a bit line transfer signal BLTX having a step-up voltage output level higher by the threshold voltage value than the source or the drain of the nMOS transistor.

FIG. 4 is a circuit diagram showing a circuit configuration for precharging a step-up node for burn-in entry according to the prior art.

Conventionally, a precharge portion is provided for precharging the step-up node for outputting a step-up voltage before carrying out a burn-in test for a semiconductor integrated circuit, as shown in FIG. 4, in order to assure normal operation of the internal step-up voltage generating unit at the time of burn-in test. The step-up voltage generating unit having the precharge portion (141 to 145, 241 to 244) for precharging the step-up node is usually called a step-up voltage pumping circuit portion.

More specifically, in the conventional step-up voltage pumping circuit portion, a step-up voltage pumping control signal is generated by a plurality of inverters 150 and a level shifter 155. This signal is supplied to a pair of pMOS transistors 133 through a pair of precharge diodes 131, 132 (diodes provided separately from the diodes 141, 241 in the precharge portion) and inverters 130, 134. In the process, a step-up voltage is generated by capacitors 135, 136 based on the control signal. The drains of the pMOS transistors 133 form a step-up node for producing a step-up voltage (SVcc) generated by the capacitors 135, 136. The precharge portion for precharging the step-up node includes a pair of precharge nMOS transistors 144, 244, a nMOS transistor 143 connected to the gate of one of the precharge transistors, and a nMOS transistor 243 connected to the gate of the other precharge transistor.

Further, the input terminal of the precharge nMOS transistor 144 of the precharge portion is connected with a capacitor 140 and the diodes 141, 142. The input terminal of the other precharge nMOS transistor 244 of the precharge portion, on the other hand, is connected with a capacitor 240 and the diodes 241, 242. The gates of the precharge nMOS transistors 144, 244 are supplied with precharge signals of opposite polarities by an inverter 145.

In the conventional internal step-up voltage generating unit shown in FIG. 4, in order to prevent the voltage level in the step-up node from excessively increasing at the time of burn-in when the burn-in test is conducted, the gates of the precharge nMOS transistors 144, 244 are floated using a burn-in entry signal bih indicating that a burn-in test is being conducted and the pumping of the gate voltage is prohibited (①of FIG. 4). Further, the level of the precharge voltage of the step-up node connected to the sources of the precharge nMOS transistors 144, 244 is set lower than the normal operation range (② of FIG. 4) (for example, to the neighborhood of the drain voltage Vcc less the threshold voltage Vth.

FIG. 5 is a circuit diagram showing a configuration of the essential circuit parts for explaining a first problem point of the prior art; FIG. 6 is a graph showing the manner in which the precharge voltage level undergoes a change in FIG. 5; and FIG. 7 is a graph showing the manner in which the voltage across the step-up node increases in FIG. 5.

The circuit of FIG. 5 is enlarged from the configuration of the precharge portion shown in FIG. 4. In the case where a nMOS transistor is used for precharging the step-up node in the step-up voltage pumping circuit portion of the type shown in FIG. 5, the gate voltage (at node n01) of the nMOS transistor is floated between Vcc−Vth and Vcc+Vth. Assume, for example, that the the gate voltage of the node n01 providing a floating node is Vcc+Vth. As shown in the graph of FIG. 6, the precharge voltage level applied to the step-up node n02 is undesirably increased beyond Vcc.

As a result, as shown in FIG. 7, the voltage at a connecting point pmpz (at a connecting point pmplz in FIG. 4, for example) across the capacitor Cn02 (a capacitor 135 in FIG. 4, for example) and the voltage across the node n02 increase to such an extent as to exceed the breakdown voltage of the transistors (a pair of nMOS transistors 133 shown in FIG. 4, for example) for producing a step-up voltage, thus posing a problem in that the transistors are destroyed.

FIG. 8 is a circuit diagram showing a configuration of the essential circuit parts for explaining a second problem point of the prior art. FIG. 9 is a graph showing the manner in which the charge escapes from the step-up node to the drain in FIG. 8.

As shown in FIG. 8, the gate voltage of the node n01 constituting a floating node can assume a value between Vcc−Vth and Vcc+Vth, and therefore the precharge nMOS transistor 144 (or 244) turns on. As a result, a current path is created between the step-up voltage SVcc and the drain voltage Vcc and a current I flows with the result that charge escapes from the node n02 toward the drain.

Consequently, as shown in FIG. 9, even after a burn-in test is started, the charge effectively contributing to the precharge operation partially escapes, thereby giving rise to the problem that the voltage across the node n02 fails to rise smoothly and the step-up efficiency is considerably deteriorated.

SUMMARY OF THE INVENTION

The present invention has been developed in view of the above-mentioned facts, and the object thereof is to provide a semiconductor integrated circuit in which an excessive rise of the voltage level across a step-up node for producing a step-up voltage is prevented at the time of a burn-in test while at the same time realizing a normal operation of a step-up voltage generating unit after starting the burn-in test to thereby improve the step-up efficiency.

In order to solve the above-mentioned problems, according to the present invention, there is provided a semiconductor integrated circuit having a function of generating a step-up voltage and supplying it to a plurality of semiconductor devices, comprising a precharge input voltage clamping unit for clamping, to a predetermined level, the input voltage of a precharge portion for precharging a step-up node which outputs the step-up voltage during the execution of a burn-in test.

According to a preferred aspect of the present invention, there is provided a semiconductor integrated circuit comprising a dynamic random access memory including a plurality of MOS transistors as the semiconductor devices, wherein the value of the step-up voltage is determined based on the threshold voltage for turning on the MOS transistors.

According to another preferred aspect of the present invention, there is provided a semiconductor integrated circuit, wherein the precharge portion includes at least a first MOS transistor and the precharge input voltage clamping unit includes at least a second MOS transistor connected to the first MOS transistor in the precharge portion, and wherein the drain voltage of the second MOS transistor in the precharge input voltage clamping unit is set to the source voltage level thereof to thereby turn off the first MOS transistor in the precharge portion.

According to still another preferred aspect of the present invention, there is provided a semiconductor integrated circuit, wherein the precharge portion includes at least a first MOS transistor and the precharge input voltage clamping unit includes at least a second MOS transistor connected to the first MOS transistor in the precharge portion and wherein the gate voltage of the second MOS transistor in the precharge input voltage clamping unit is set to the step-up voltage level so that the first MOS transistor in the precharge portion acts as a diode.

According to still another preferred aspect of the present invention, there is provided a semiconductor integrated circuit having a step-up voltage circuit for supplying a step-up voltage to a plurality of circuit portions in a first line period. In this case, the step-up voltage circuit comprises a precharge transistor connected between a power source and a step-up node; and a precharge input voltage clamping unit for clamping a gate level of the precharge transistor in a burn-in test period.

In a semiconductor integrated circuit according to the present invention, the precharge transistor of the precharge portion is clamped to a predetermined level thereby to clamp the node on the input side of the precharge transistor appropriately during the period during which the burn-in test is conducted. In this way, the voltage level across the step-up node for producing a step-up voltage at the time of the burn-in test can be prevented from excessively increasing, while at the same time realizing the normal operation of the step-up voltage generating unit rapidly after starting the burn-in test.

BRIEF DESCRIPTION OF THE DRAWINGS

The above objects and features of the present invention will be more apparent from the following description of some preferred embodiments with reference to the accompanying drawings, wherein.

DESCRIPTION OF THE PREFERRED EMBODIMENTS

Now, preferred embodiments of the present invention will be explained with reference to the accompanying drawings (FIGS. 10 to 23).

Figure 10:
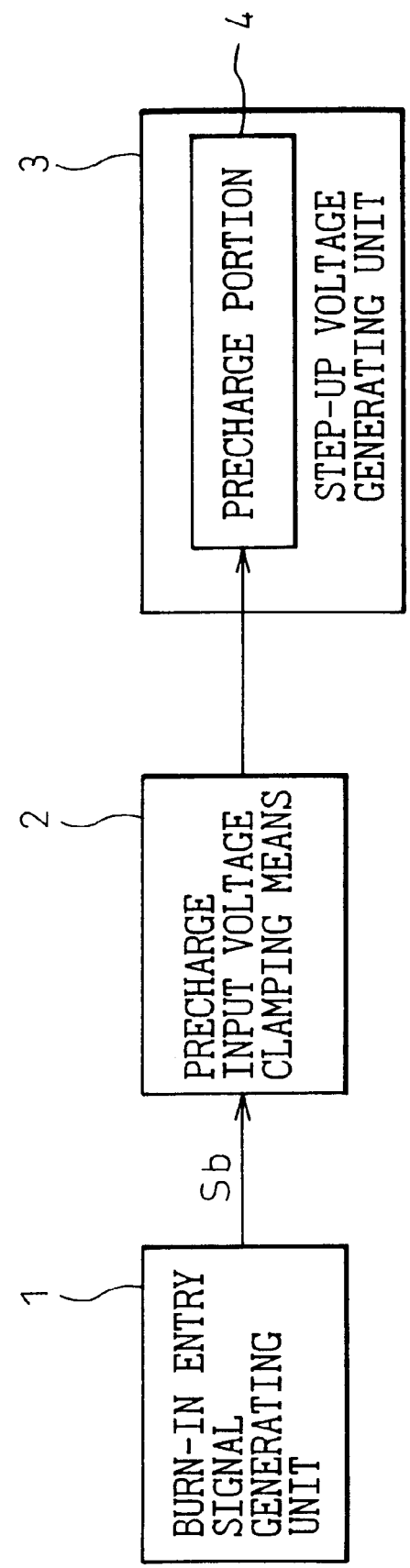
FIG. 10 is a block diagram showing an embodiment based on the basic principle of the present invention.

FIG. 10 is a block diagram showing an embodiment based on the basic principle of the present invention. In this embodiment, a configuration of a semiconductor integrated circuit is shown in a simplified fashion.

The semiconductor integrated circuit according to an embodiment of the invention shown in FIG. 10 has the function (such as a step-up voltage generating unit 3) of generating a step-up voltage and supplying it to a plurality of semiconductor devices and a precharge input voltage clamping unit 2 for clamping to a predetermined level the input voltage of a precharge portion 4 for precharging the step-up node outputting the step-up voltage during the period when a burn-in test is conducted. The period during which the burn-in test is conducted is determined by a burn-in control signal Sb including a burn-in entry signal output from a burn-in entry signal generating unit 1.

Preferably, in the case in which a semiconductor integrated circuit according to an embodiment of the present invention as shown in FIG. 10 comprises a dynamic random access memory including a plurality of MOS transistors as a semiconductor device, the value of the step-up voltage is preferably determined based on the threshold voltage for turning on the MOS transistors.

Further, a semiconductor integrated circuit according to an embodiment of the present invention, as shown in FIG. 10, is preferably configured in such a manner that the precharge portion 4 includes at least a first MOS transistor, and the precharge input voltage clamping unit 2 includes at least a second MOS transistor connected to the first MOS transistor in the precharge portion 4, in which case the drain voltage of the second MOS transistor in the precharge input voltage clamping unit 2 is set to the source voltage level (or the ground level, i.e., the earth level) thereof to thereby turn off the first MOS transistor in the precharge portion 4.

Furthermore, a semiconductor integrated circuit according an embodiment of the present invention as shown in FIG. 10 is configured in such a manner that the precharge portion 4 includes at least a first MOS transistor, and the precharge input voltage clamping unit 2 includes at least a second MOS transistor connected to the first MOS transistor in the precharge portion, in which case the gate voltage of the MOS second transistor in the precharge input voltage clamping unit is set to the same level as the step-up voltage to thereby operate the first MOS transistor in the precharge portion as a diode.

With a semiconductor integrated circuit according to the invention, in order to prevent the voltage level across the step-up node for outputting a step-up voltage at the time of a burn-in test from increasing excessively, the input voltage to the precharge portion 4 is basically clamped to a predetermined level during the execution of the burn-in test. For explaining the principle of the invention in more detail, two basic circuits as shown in FIGS. 11 and 12 are proposed.

Figure 11:
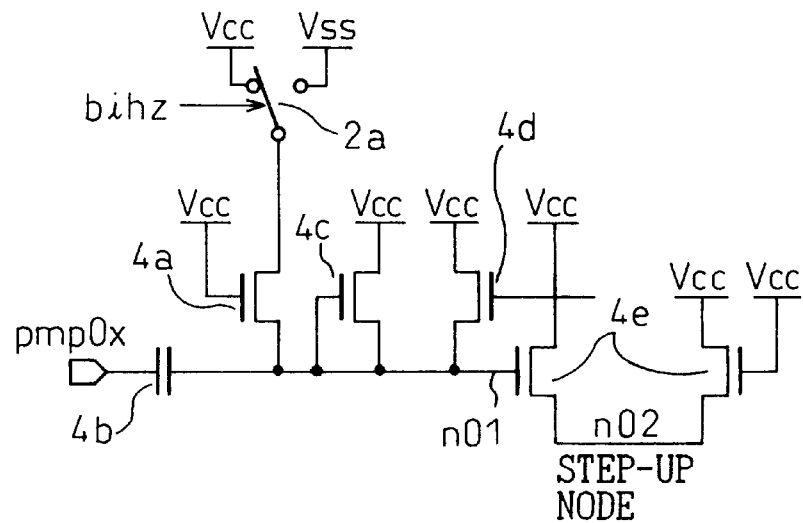
FIG. 11 is a circuit block diagram showing a first example of the basic circuit according to the embodiment of FIG. 10.
Figure 12:
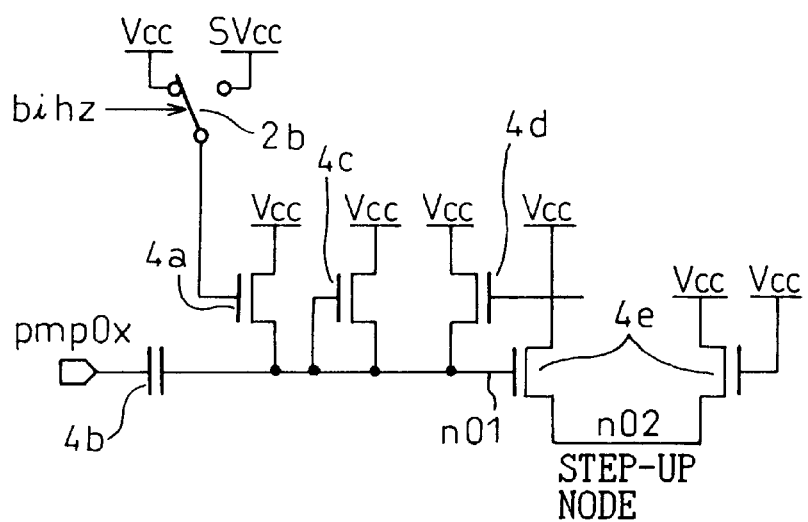
FIG. 12 is a circuit block diagram showing a second example of the basic circuit according to the embodiment of FIG. 10.

FIG. 11 is a circuit block diagram showing a first example of a basic circuit according to the embodiment of FIG. 10, and FIG. 12 is a circuit block diagram showing a second example of a basic circuit according to the embodiment of FIG. 10. These diagrams show a precharge input voltage clamping unit and a precharge portion in the embodiment shown in FIG. 10. In the description that follows, component parts similar to those described above are designated by the same reference numerals as those described above, respectively.

In the first example of the basic circuit shown in FIG. 11, in order to clamp the gate voltage of a precharge transistor of a precharge transistor circuit portion 4e for precharging a step-up node n02 to a source voltage Vss at the time of a burn-in test, the drain voltage of the transistor 4a for clamping the precharge input voltage is clamped to the source voltage Vss taking advantage of a burn-in entry signal (bihz).

More specifically, in FIG. 11, the voltage across the node n01 connected with a precharge capacitor 4b, a precharge input voltage clamping diode 4c and a precharge input drive transistor circuit portion 4d, is clamped to the level of Vcc–Vth by the transistor 4a for clamping the precharge input voltage under the normal operating condition. At the time of a burn-in test, in contrast, a drain voltage-fixing change-over switch portion 2a is switched in such a manner as to set the drain voltage of the precharge input voltage-clamping transistor 4a to the source voltage Vss by using the burn-in entry signal. In this way, the node n01 can be clamped stably to the source voltage Vss. In other words, in the present case, the precharge transistor is kept in off state at the time of a burn-in test.

According to a second example of the basic circuit shown in FIG. 12, on the other hand, the gate voltage of the precharge transistor of the precharge transistor circuit portion 4e for precharging the step-up node n02 at the time of a burn-in test is clamped to the drain voltage Vcc by use of the burn-in entry signal and thus by switching the gate voltage of the precharge input voltage-clamping transistor 4a to the step-up voltage SVcc.

More specifically, also in FIG. 12 as in the case of FIG. 11 described above, the voltage across the node n01 is clamped to the level of Vcc–Vth by the precharge input voltage-clamping transistor 4a. At the time of a burn-in test, on the other hand, a gate voltage fixing change-over switch portion 2b is operated in such a manner as to set the gate voltage of the precharge input voltage-clamping transistor 4a to the step-up voltage SVcc using the burn-in entry signal. In this way, the node n01 can be clamped stably to the drain voltage Vcc. In other words, in this case, the precharge transistor can act as a diode at the time of a burn-in test.

According to an embodiment of the present invention based on the fundamental principle of a semiconductor integrated circuit, a precharge transistor of the precharge portion can be clamped to a predetermined level during the period of a burn-in test thereby to clamp the node on the input side of the precharge transistor. As a result, the voltage level of the step-up node for outputting a step-up voltage is prevented from excessively increasing at the time of a burn-in test, while at the same time realizing the normal operation of the step-up voltage generating unit rapidly after starting the burn-in test.

Figure 13A:
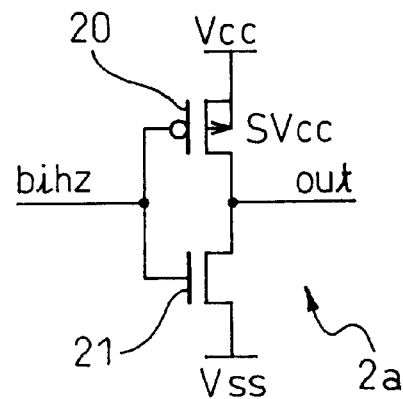
FIGS. 13(A) and 13(B) are diagrams showing a configuration and an operation voltage waveform of the first example of FIG. 11 according to a preferred embodiment, respectively.
Figure 13B:
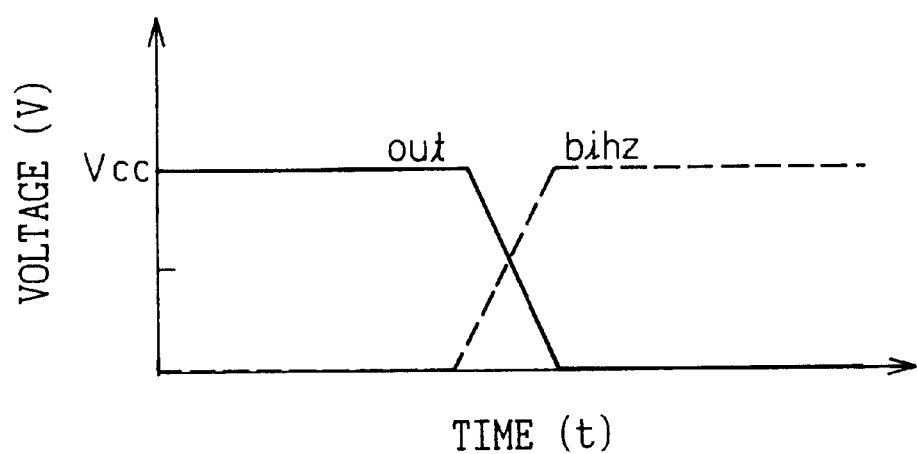

FIGS. 13(A) and 13(B) are diagrams showing a configuration and an operation voltage waveform of a preferred embodiment based on the first example (hereinafter referred to as a first preferred embodiment) shown in FIG. 11, respectively. In these diagrams, as in FIG. 11 described above, the configuration of a semiconductor integrated circuit is shown in a simplified fashion.

The first preferred embodiment shown in FIG. 13(A) comprises an inverter circuit portion as the drain voltage-fixing change-over switch portion 2a configured of a pMOS transistor 20 for fixing the drain voltage and an nMOS transistor 21 for fixing the drain voltage.

In this case, a burn-in entry signal (bihz), as shown in FIG. 13(B), assumes a low level ("L") at the time of normal operation and a high level ("H") at the time of a burn-in test. In the case in which the burn-in entry signal is applied to the inverter circuit portion, therefore, the level of the output voltage (out) of the inverter circuit portion assumes a value Vcc at the time of normal operation and a value Vss at the time of a burn-in test.

Figure 14A:
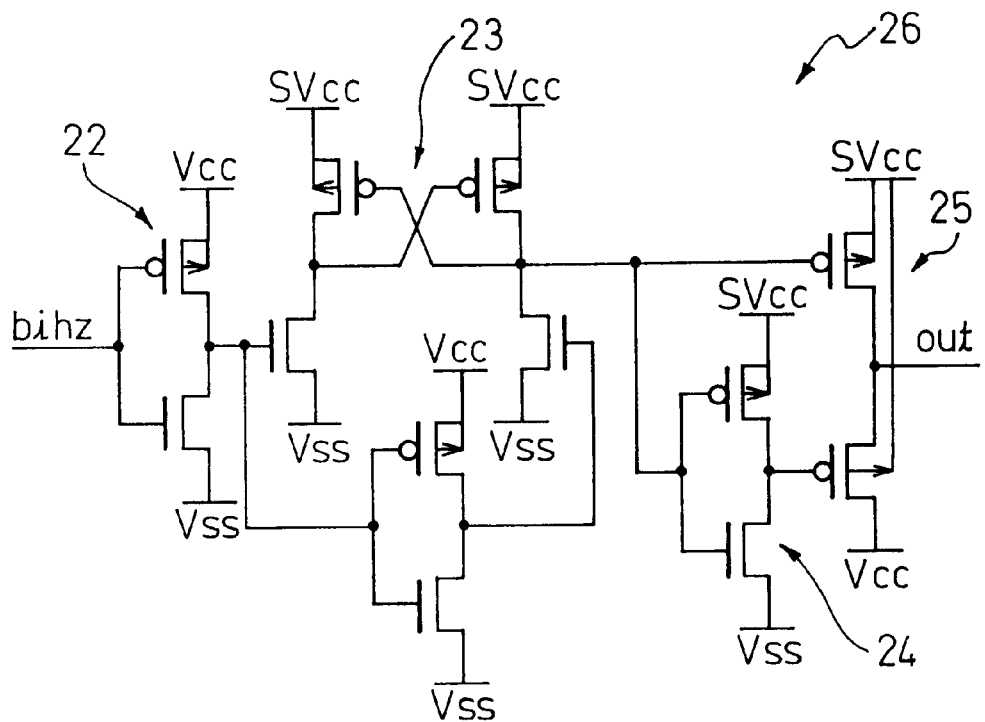
FIGS. 14(A) and 14(B) are diagrams showing a configuration and an operation voltage waveform of the second example of FIG. 12 according to a preferred embodiment, respectively.
Figure 14B:
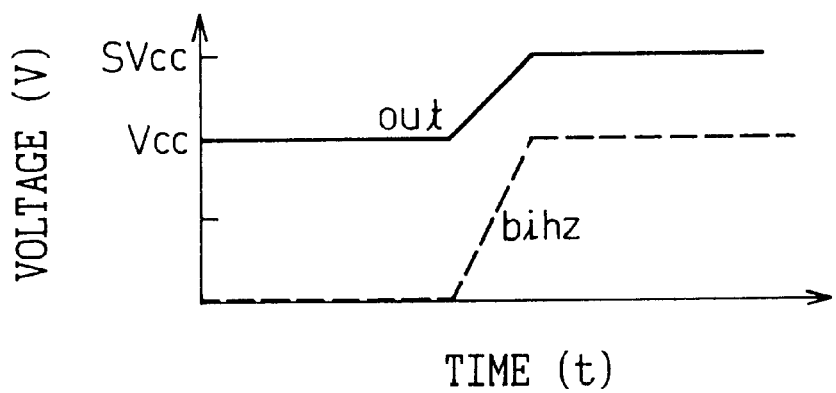

FIGS. 14(A) and 14(B) are diagrams showing a configuration and an operation voltage waveform of a preferred embodiment based on the second example (hereinafter referred to as a second preferred embodiment) shown in FIG. 12, respectively. In these diagrams, too, as in FIG. 12 described above, the configuration of the semiconductor integrated circuit is shown in a simplified fashion.

According to the second preferred embodiment shown in FIG. 14(A), the above-mentioned change-over switch section 2b for fixing the gate voltage includes a first inverter 22 for receiving a burn-in entry signal (bihz), a flip-flop circuit portion 23 for shifting the level of the signal waveform, a second inverter 24, and a gate voltage-fixing signal output means 25 connected to the gate of the precharge transistor of the precharge portion.

In this case, the burn-in entry signal (bihz), as shown in FIG. 14(B), assumes a low level ("L") at the time of normal operation and a high level ("H") at the time a burn-in test. In the case where this burn-in entry signal is applied to the first inverter 22 shown in FIG. 14(A), therefore, the output voltage (out) of the gate voltage-fixing signal output means 25 assumes a value Vcc at the time of normal operation and a value SVcc at the time of a burn-in test.

Figure 15:
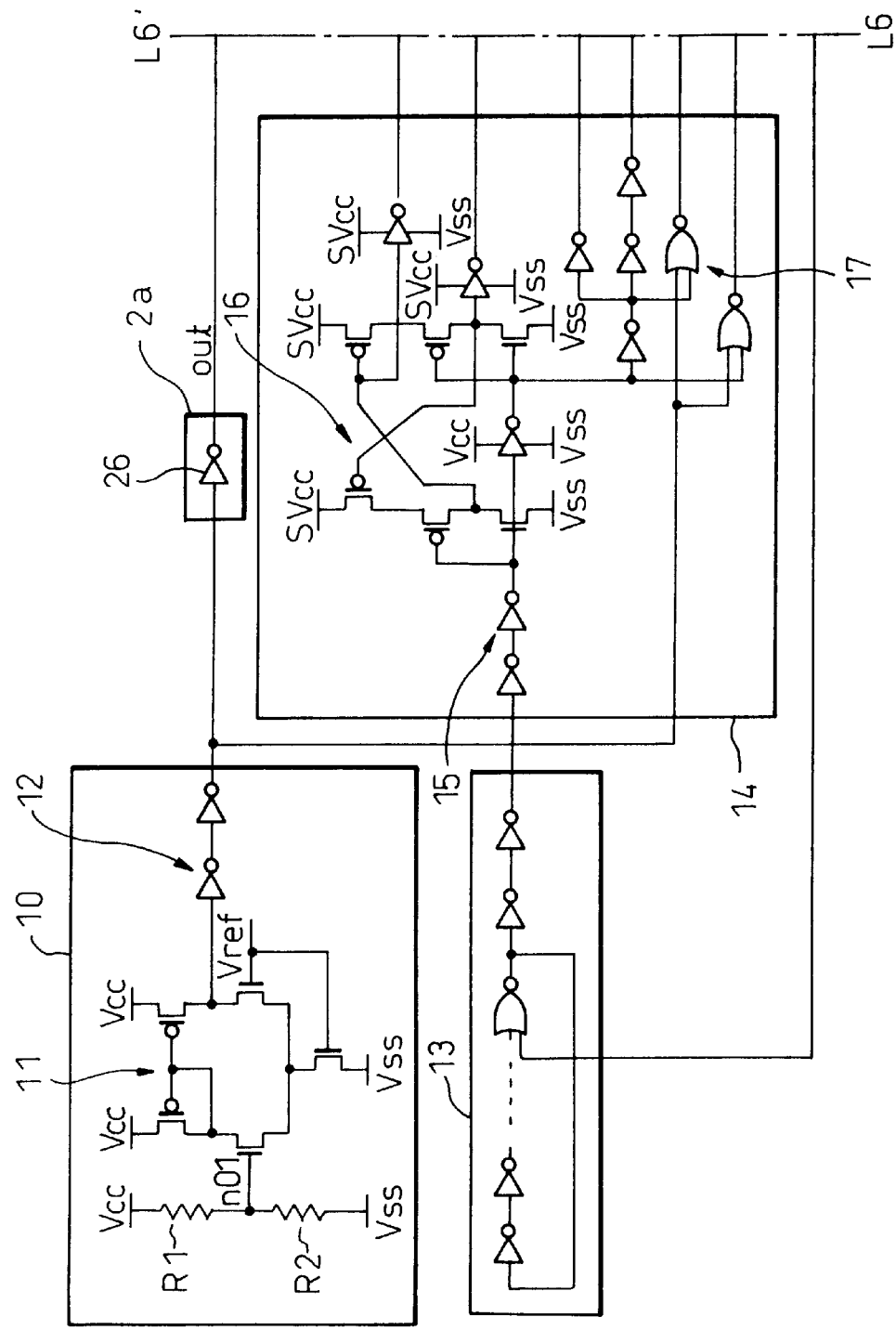
FIG. 15 is a circuit diagram (No. 1) showing a general configuration according to a first preferred embodiment of the present invention.
Figure 16:
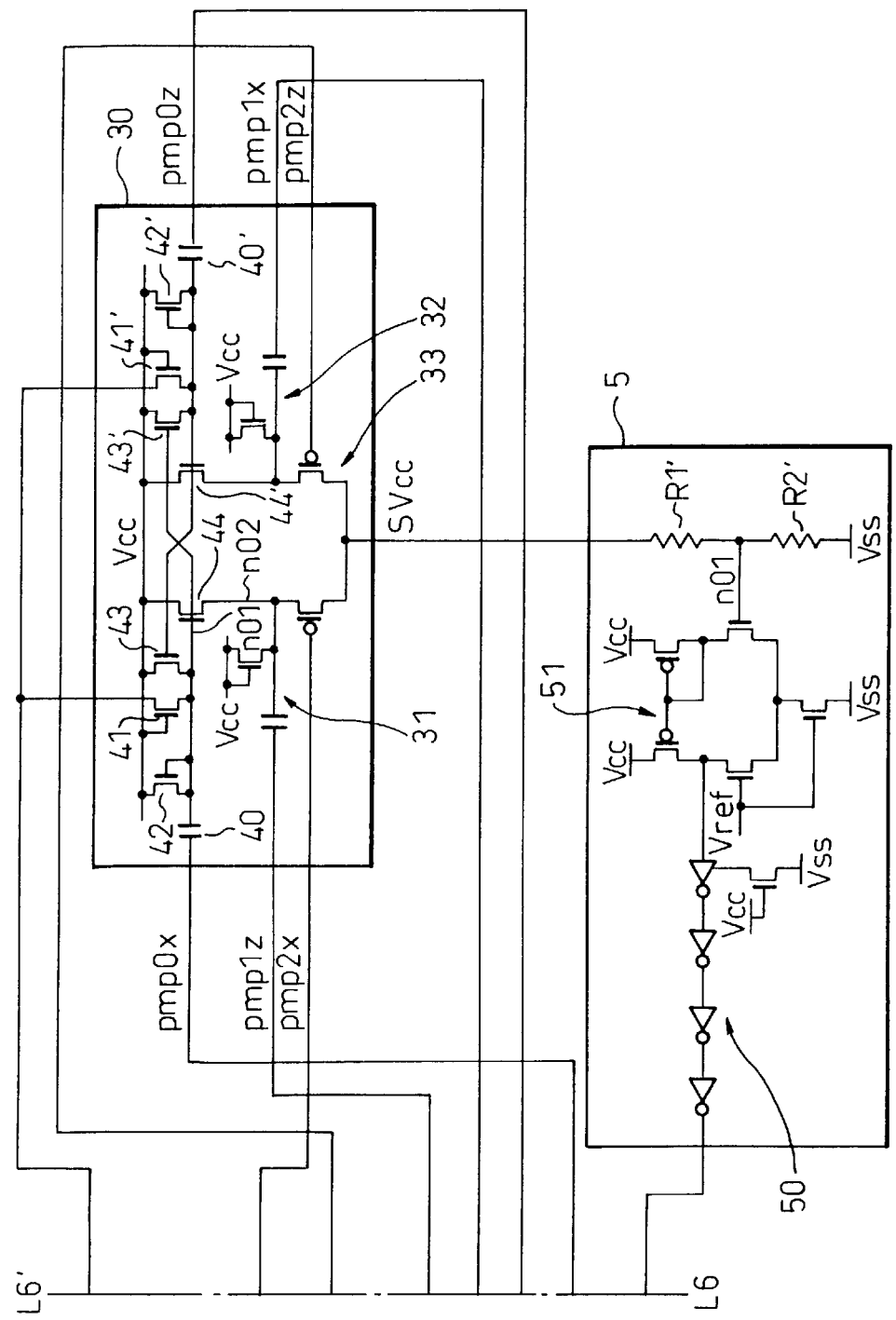
FIG. 16 is a circuit diagram (No. 2) showing a general configuration according to a first preferred embodiment of the present invention.

FIGS. 15 and 16 are circuit diagrams 1 and 2, respectively, showing a general configuration of the first preferred embodiment of the present invention.

In FIG. 15, in addition to the drain voltage-fixing change-over switch 2a according to the first preferred embodiment of the invention, a semiconductor integrated circuit has formed therein a burn-in entry signal generating unit 10 for generating a burn-in entry signal, a step-up voltage pumping oscillation circuit portion 13 for generating a signal for precharging the step-up voltage and performing the pumping operation on the step-up voltage, and a step-up voltage pumping control signal generating circuit portion for generating a control signal to control the step-up voltage pumping operation.

In FIG. 16, a semiconductor integrated circuit has formed therein a step-up voltage pumping circuit portion 30 having the function of precharging a step-up node for outputting a step-up voltage and a detection circuit portion 5 for detecting the level of the step-up voltage.

Further, in FIG. 15, an inverter 26 is used as the drain voltage-fixing change-over switch portion 2a according to the first preferred embodiment of the present invention in place of the inverter circuit portion (FIG. 13) configured of two types of MOS transistors. The operation of this inverter is identical to that shown in FIG. 13. The operation voltage waveform of the inverter 26, therefore, will not be described again.

The burn-in entry signal generating unit 10 of FIG. 15 has the function of generating and supplying a burn-in entry signal (bihz) to the step-up voltage pumping circuit portion 30. The burn-in entry circuit portion 10 includes two resistors R1, R2 for converting the input level, a differential amplifier circuit portion 11 and a two-stage inverter 12 for shaping the signal waveform. In this burn-in entry signal generating unit 10, first, the level of the input voltage Vcc is converted by the resistors R1, R2. The difference between the voltage on the node n01 obtained as a result of this operation and a reference voltage Vref is amplified by a differential amplifier circuit portion 11 and shaped by the two-stage inverter 12 to thereby produce a burn-in entry signal.

The step-up voltage pumping oscillation circuit portion 13 shown in FIG. 15 includes a plurality of stages of inverters and at least a logic circuit element including a NOR circuit. Further, the pumping control signal generating unit 14 includes a two-stage inverter 15, an oscillation circuit portion 16 for generating a control signal to control the step-up voltage pumping operation and a logic circuit portion 17 having a plurality of logic circuit elements.

Figure 4:
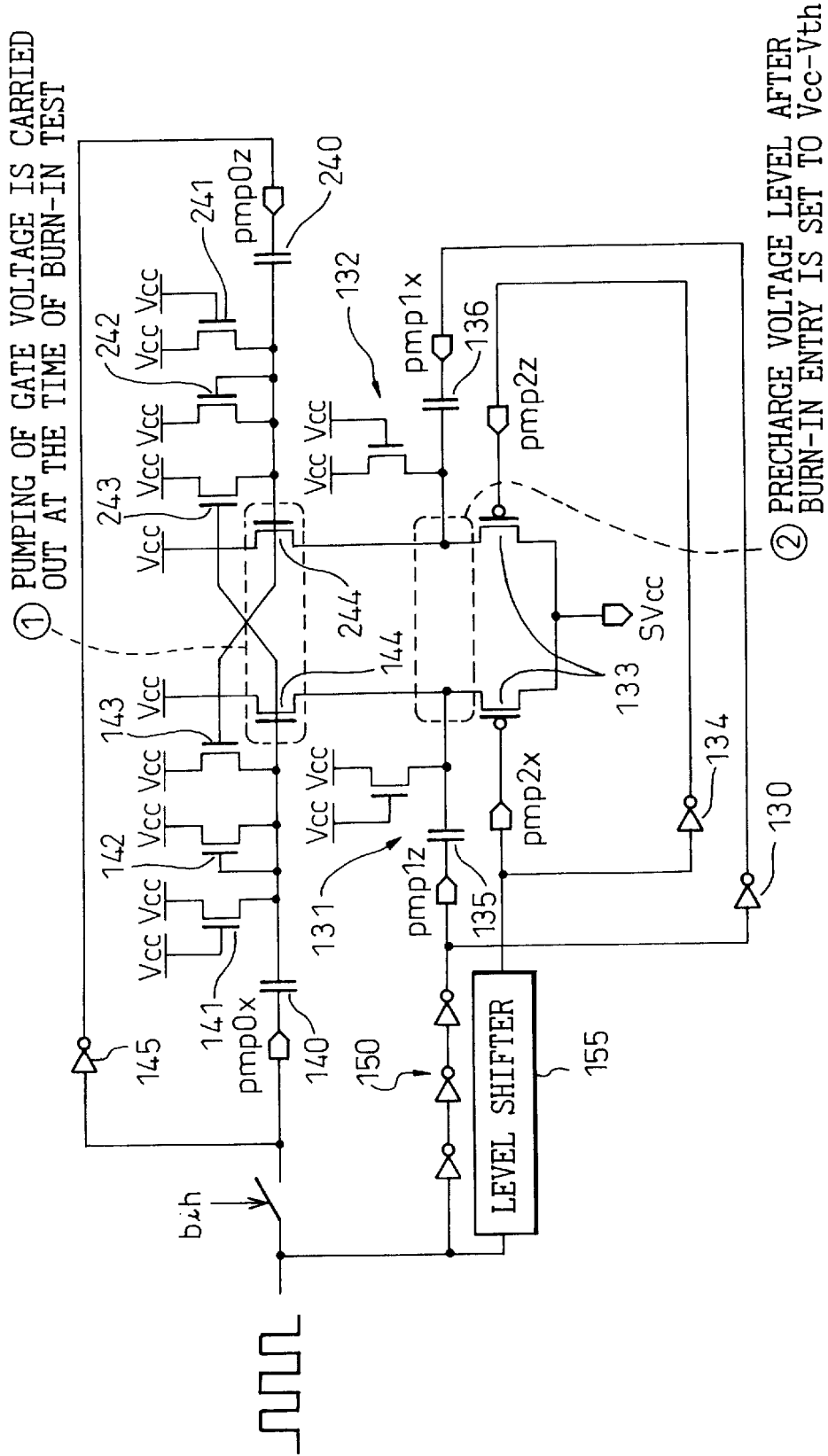
FIG. 4 is a circuit diagram showing a circuit configuration for precharging a step-up node for burn-in entry according to the prior art.
Figure 5:
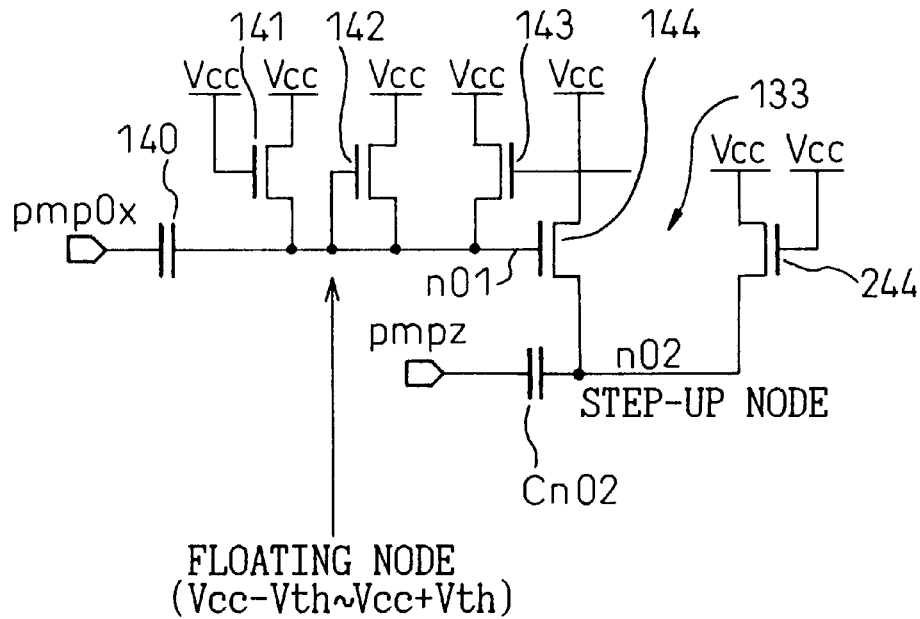
FIG. 5 is a circuit diagram showing a configuration of the essential circuit parts for explaining a first problem of the prior art.
Figure 6:
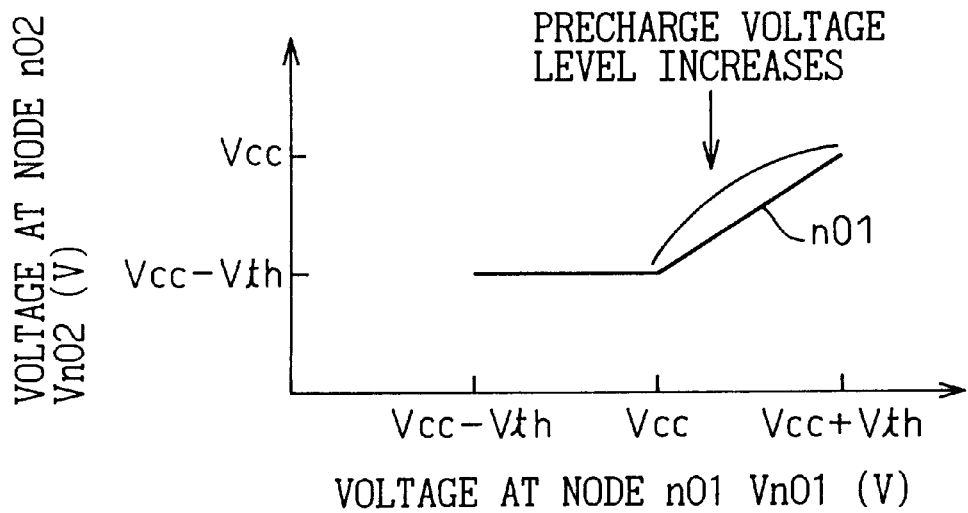
FIG. 6 is a graph showing the manner in which the precharge voltage level changes in FIG. 5.

The step-up voltage pumping circuit portion 30 of FIG. 16, on the other hand, has substantially the same configuration as the step-up voltage pumping circuit portion of FIG. 4 described above.

In order to assure normal operation of the internal step-up voltage generating circuit portion (31 to 33) even when the burn-in test of the semiconductor integrated circuit is conducted, the step-up voltage pumping circuit portion 30 of FIG. 16 includes a precharge portion (40 to 44 and 40' to 44') for precharging the step-up node for outputting the step-up voltage before execution of the burn-in test.

More specifically, in the step-up voltage pumping circuit portion of FIG. 16, a control signal from the oscillation circuit portion 16 (FIG. 15) is applied to a pair of pMOS transistors 33 through a pair of step-up voltage-setting diodes 31, 32. The drains of the pMOS transistors 33 make up a step-up node n02 for producing a step-up voltage (SVcc). The precharge portion for precharging the step-up node includes a pair of precharge nMOS transistors 44, 44', a nMOS transistor 43 connected to the gate of one of the precharge nMOS transistors 44, 44', and a nMOS transistor 43' connected to the gate of the other of the precharge nMOS transistors 44, 44'.

Further, the input terminal of the precharge nMOS transistor 44 of the precharge portion is connected to a capacitor 40 and diodes 41, 42. The input terminal of the other precharge nMOS transistor 44' of the precharge portion, on the other hand, is connected to a capacitor 40' and diodes 41', 42'. The gates of these precharge nMOS transistors 44, 44' are supplied with precharge signals of opposite polarities, respectively.

Furthermore, the step-up voltage level detection circuit portion 5 of FIG. 16 includes two resistors R1', R2' for detecting the level of the step-up voltage (SVcc), a differential amplifier circuit portion 51 for amplifying the difference between the detection voltage detected by the resistors R1', R2' and a reference voltage Vref, and a plurality of stages of inverters for converting the level of the waveform of the output voltage of the differential amplifier circuit portion 51 and feeding it back to the step-up voltage pumping oscillation circuit portion 13.

Figure 17:
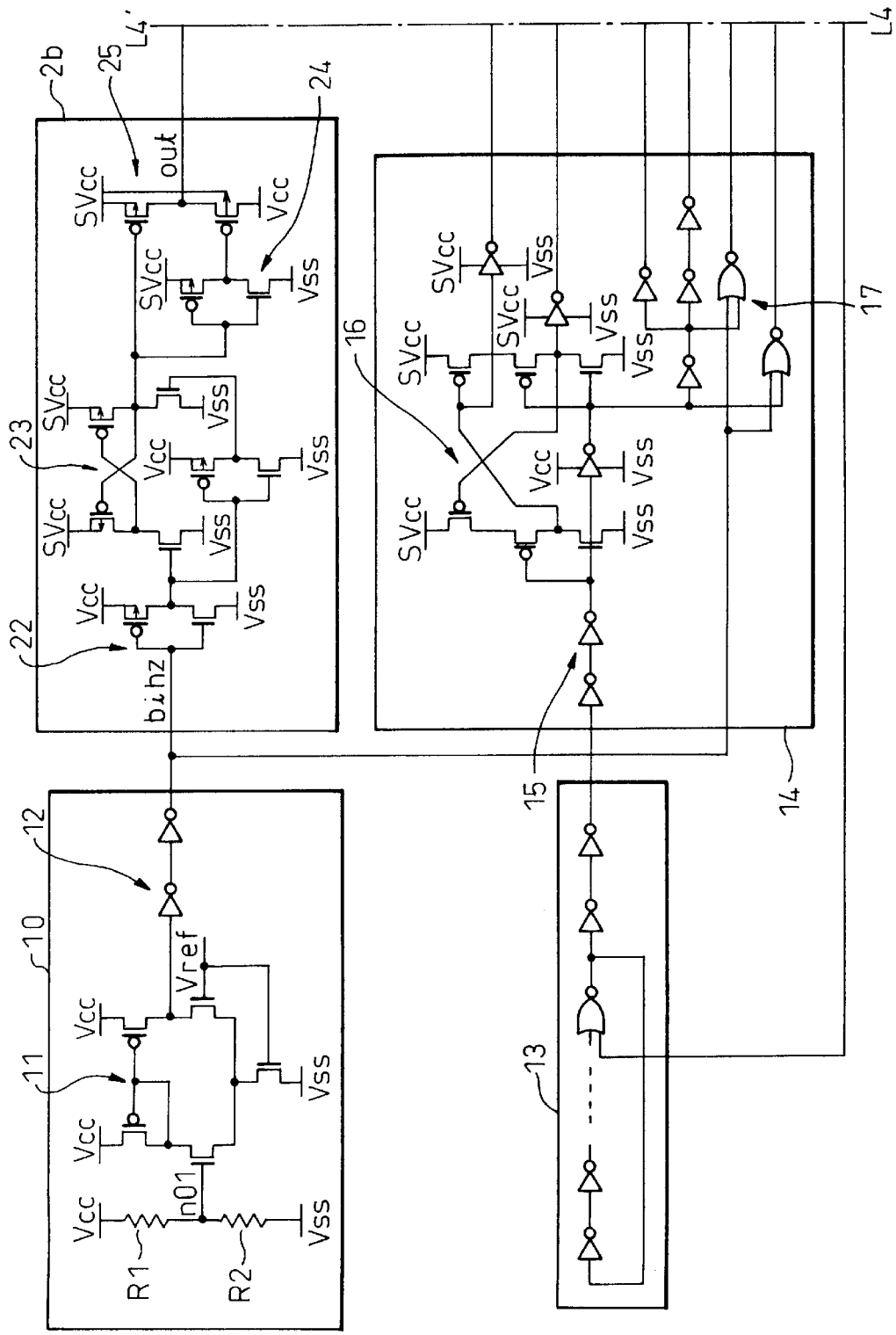
FIG. 17 is a circuit diagram (No. 1) showing a general configuration according to a second preferred embodiment of the present invention.
Figure 18:
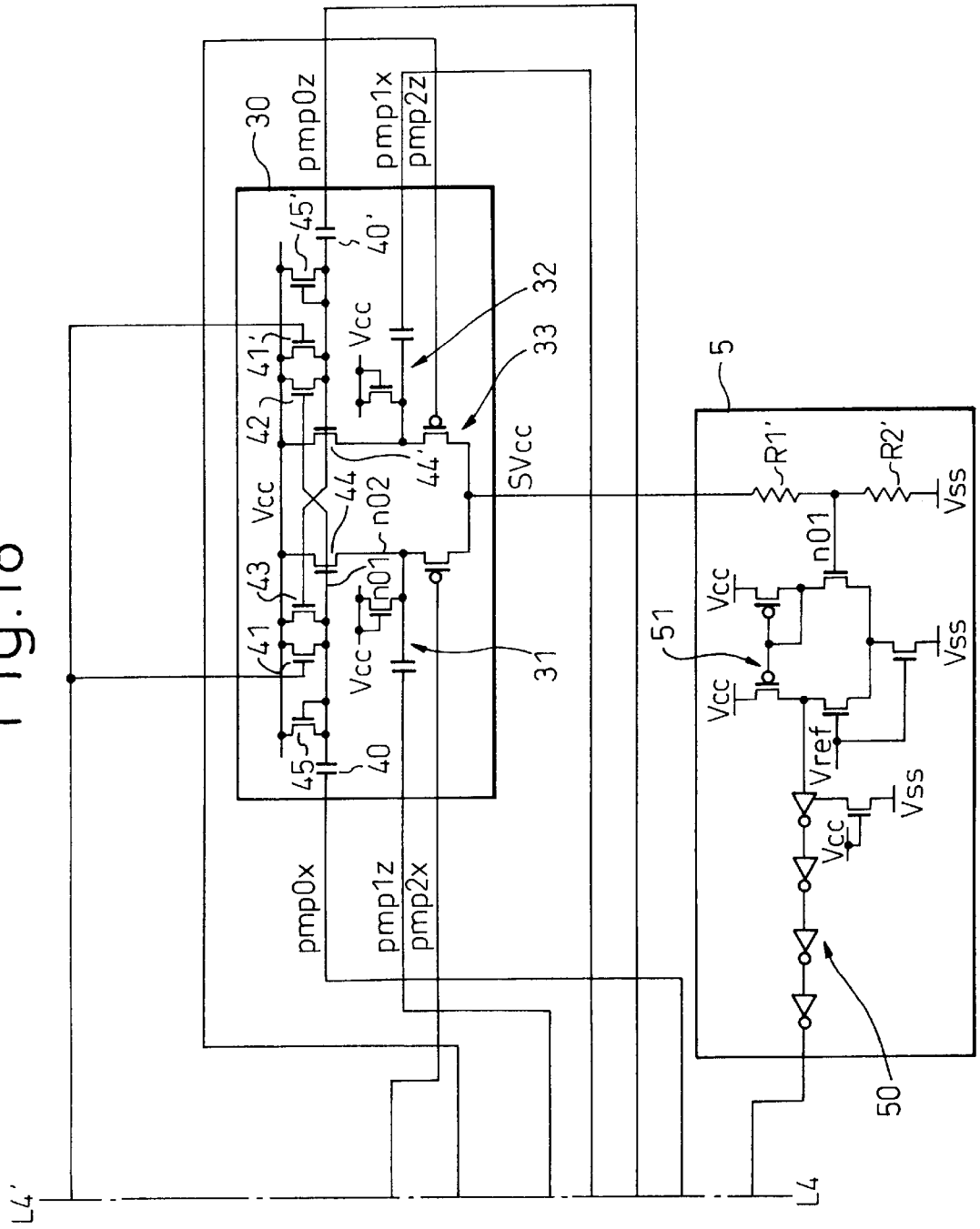
FIG. 18 is a circuit diagram (No. 2) showing a general configuration according to a second preferred embodiment of the present invention.

FIGS. 17 and 18 are circuit diagrams 1 and 2, respectively, showing a general configuration of a second preferred embodiment of the invention.

In FIG. 17, in addition to the gate voltage-fixing change-over switch portion 2b according to the second preferred embodiment of the invention, a semiconductor integrated circuit has formed therein a burn-in entry circuit portion 10 for generating a burn-in entry signal, a step-up voltage pumping oscillation circuit portion 13 for precharging the step-up voltage and generating a signal for performing the step-up voltage pumping operation, and a step-up voltage pumping control signal generating circuit portion 14 for generating a control signal to control the step-up voltage pumping operation.

In FIG. 18, a semiconductor integrated circuit has formed therein a step-up voltage pumping circuit portion 30 having the function of precharging the step-up node for producing a step-up voltage and a detection circuit portion for detecting the level of the step-up voltage.

Further, in FIG. 17, the gate voltage-fixing change-over switch portion 2b according to the second embodiment of the present invention, like the drain voltage-fixing change-over switch portion of FIG. 15 described above, includes a first inverter 22 for receiving a burn-in entry signal (bihz), a flip-flop circuit portion 23 for shifting the level of the signal waveform, and a gate voltage-fixing signal output means 25 connected to the gate of the precharge transistor of the precharge portion. Therefore, the configuration of the gate voltage-fixing change-over switch portion 2b of FIG. 17 will not be described in detail.

Furthermore, in the step-up voltage pumping circuit portion 30 of FIG. 18, the drain voltage of the precharge nMOS transistors 44, 44' is set to a voltage Vii higher than Vcc in FIG. 16 in view of the need of clamping the voltage of the node n01 to the high voltage level Vcc.

Except for the above-mentioned points, the circuit configurations in FIGS. 17 and 18 other than the gate voltage-fixing change-over switch portion 2b (FIG. 17) are exactly identical to that in FIGS. 15 and 16 previously described, and will not be described in detail.

Figure 19:
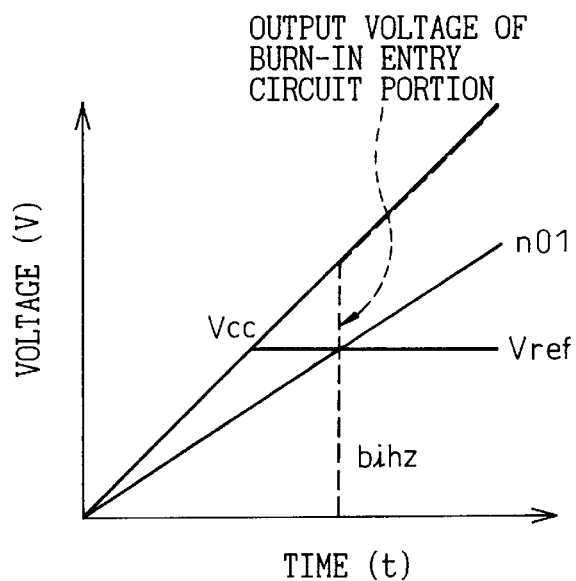
FIG. 19 is a graph showing the manner in which the output voltage of a burn-in entry signal generating unit of FIG. 18 changes with time.

FIG. 19 is a graph showing the temporal change of the output voltage of the burn-in entry circuit portion shown in FIGS. 17 and 18.

In the burn-in entry circuit portion 10 shown in FIGS. 17 and 18, a burn-in entry signal is generated by setting the resistance values of the resistors R1, R2 in such a manner that the voltage Vcc of the node n01 at the time of normal operation exceeds a reference voltage Vref at a point just above the output voltage of the burn-in entry circuit portion.

Figure 20:
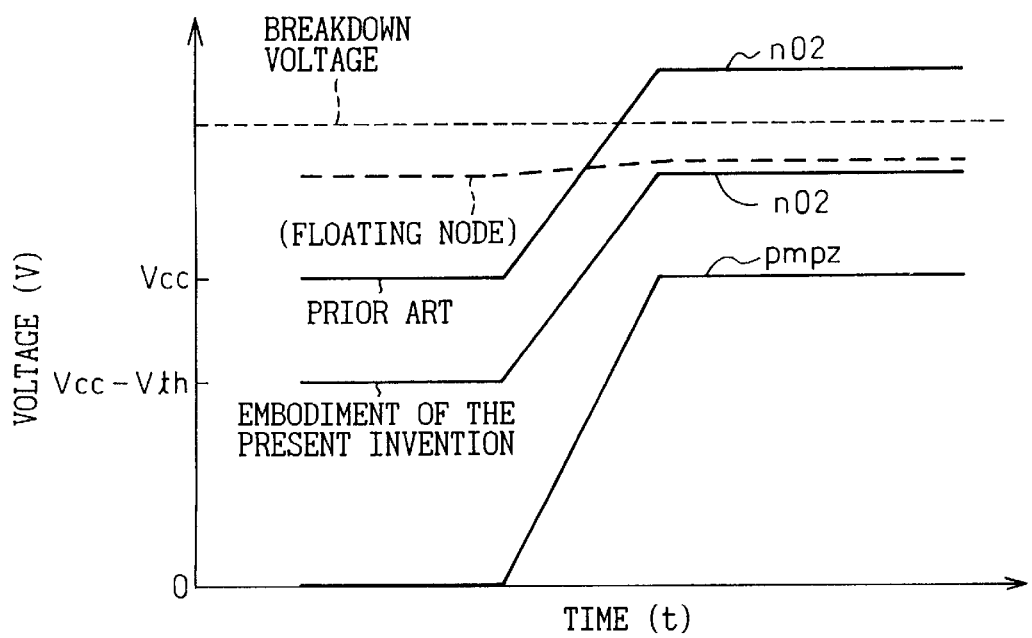
FIG. 20 is a graph showing the manner in which the the voltage across the step-up node is prevented from increasing excessively according to a preferred embodiment of the present invention.
Figure 21:
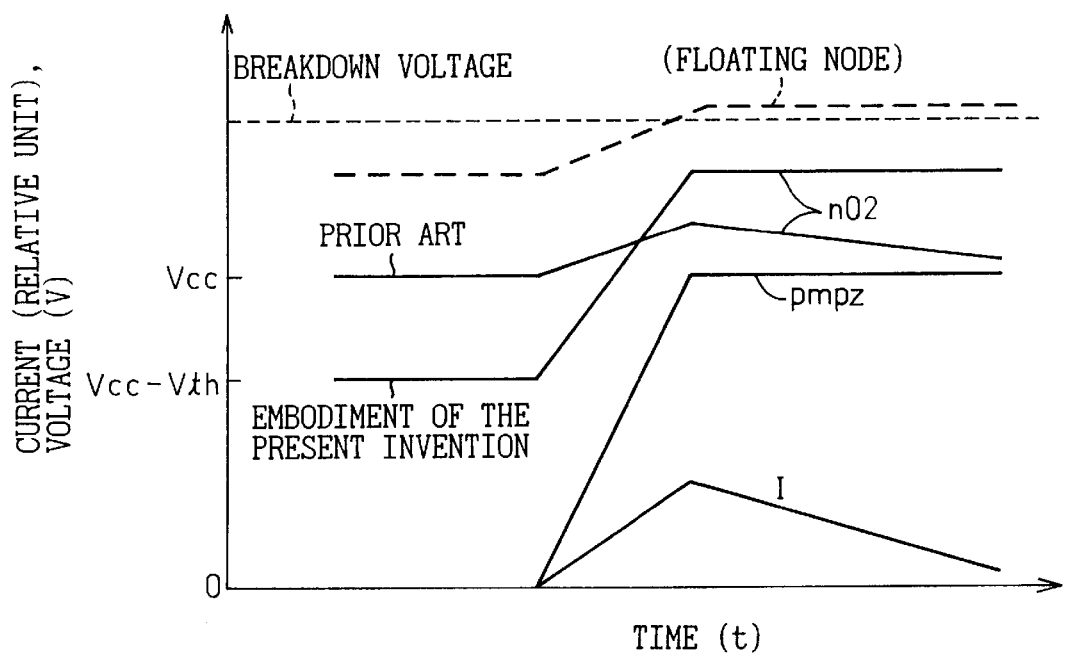
FIG. 21 is a graph showing the manner in which the normal operation of a step-up voltage generating unit is realized after burn-in entry according to a preferred embodiment of the present invention.

FIG. 20 is a graph showing the manner in which the voltage across the step-up node is prevented from excessively increasing according to an embodiment of the invention, and FIG. 21 is a graph showing the manner in which the normal operation of the step-up voltage generating circuit portion is realized after burn-in entry according to an embodiment of the invention.

Figure 7:
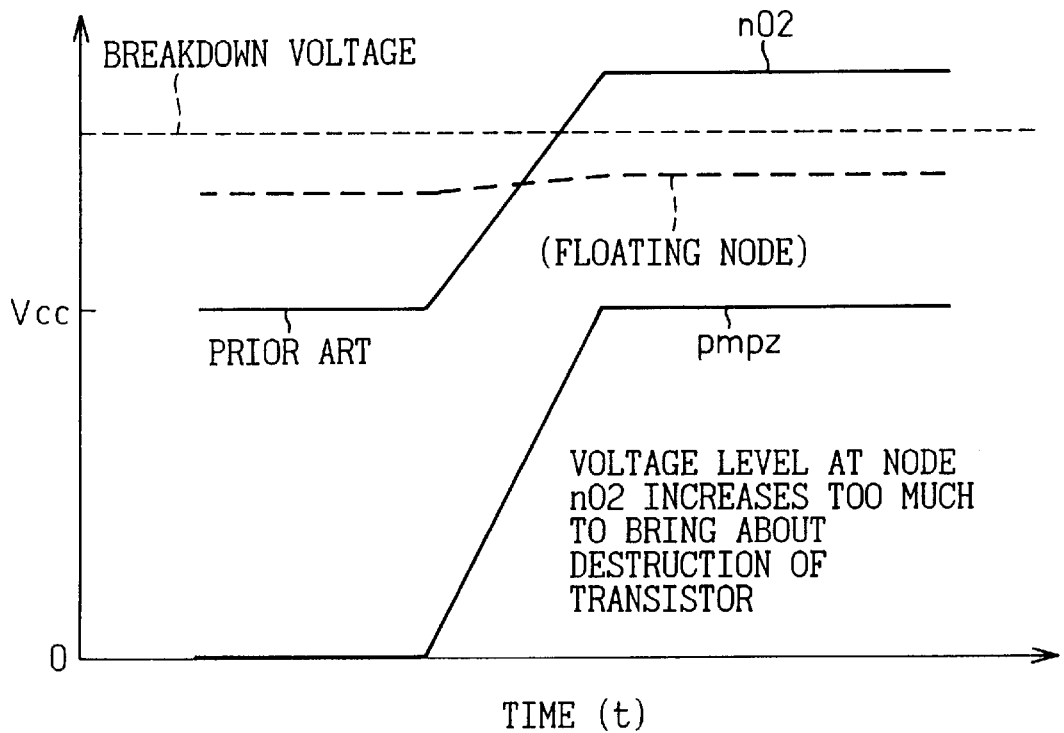
FIG. 7 is a graph showing the manner in which the voltage across the step-up node increases in FIG. 5.
Figure 8:
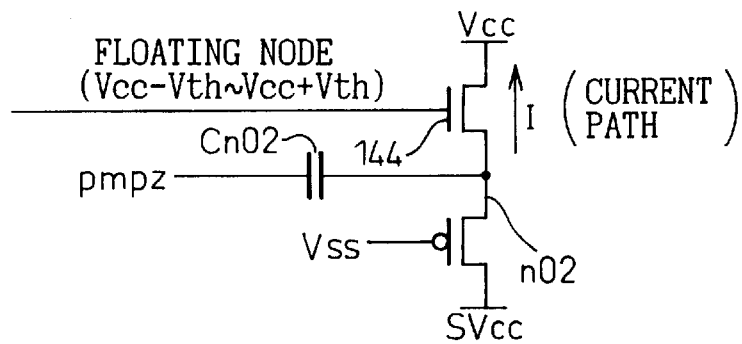
FIG. 8 is a circuit diagram showing a configuration of the essential circuit parts for explaining a second problem of the prior art.
Figure 9:
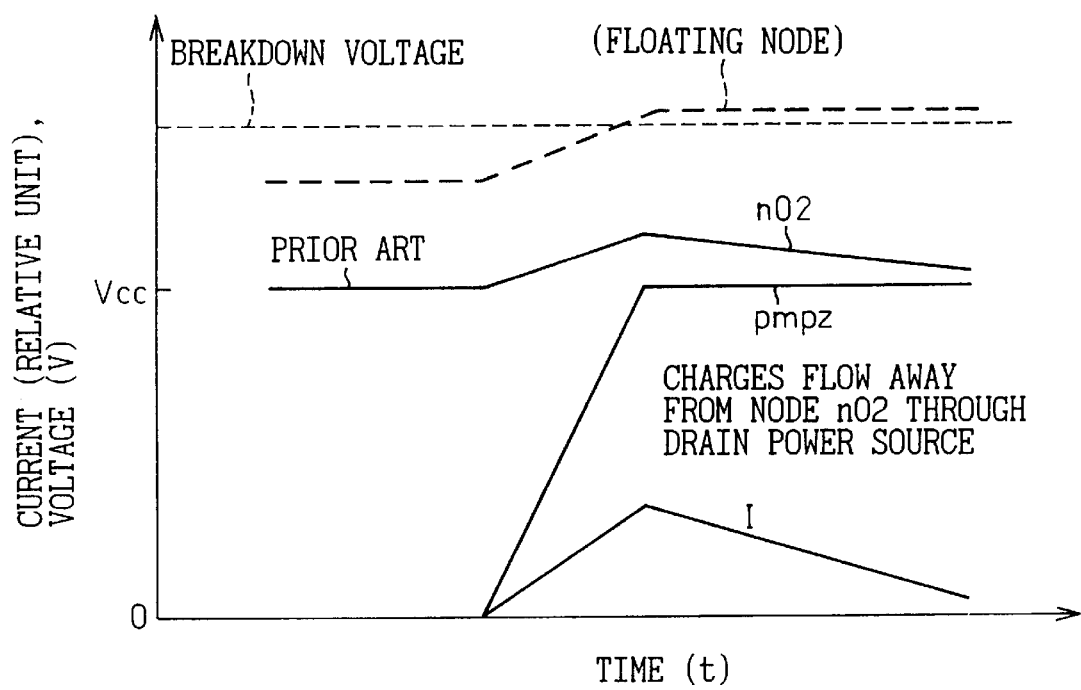
FIG. 9 is a graph showing the manner in which charge escapes from the step-up node to the drain in FIG. 8.

These graphs are shown for comparing the change in the node n02 at the time of a burn-in test conducted according to an embodiment of the invention with the change of the node n02 at the time of a burn-in test conducted according to the prior art as described in FIGS. 7 and 9.

As is obvious from FIG. 20, according to an embodiment of the present invention, the gate voltage of the precharge nMOS transistor is clamped to Vss or Vcc, and therefore, the voltage level of the node n02 (or node n01) is prevented from excessively increasing at the time of a burn-in test. Further, as apparent from FIG. 21, according to an embodiment of the present invention, a current path is not generated between the step-up voltage SVcc and the drain voltage SVcc. After starting the burn-in test, therefore, the normal operation of the step-up voltage generating circuit portion can be quickly realized for an improved step-up efficiency over the prior art.

Figure 22:
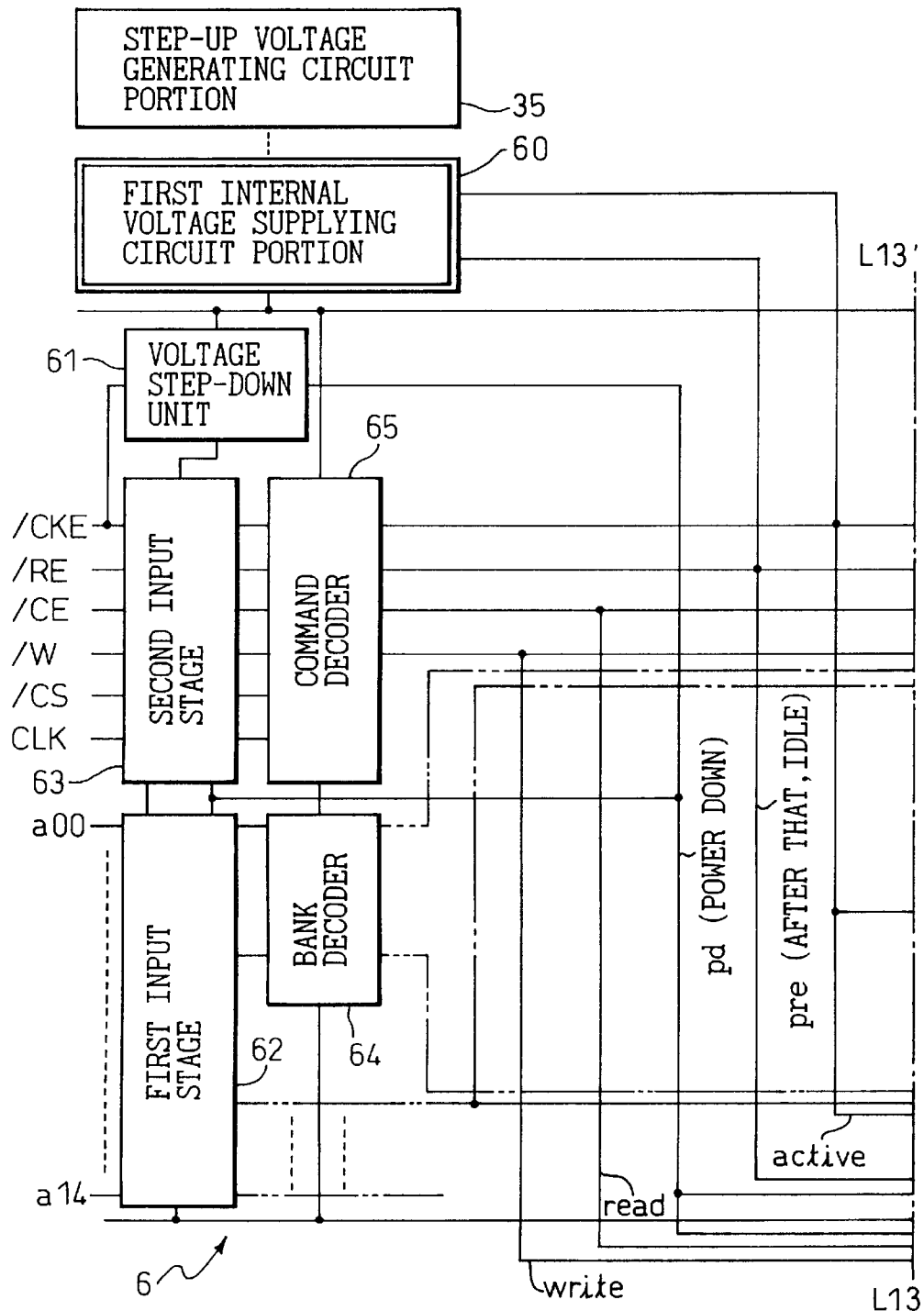
FIG. 22 is a circuit block diagram (No. 1) showing a general configuration of a chip to which a semiconductor integrated circuit according to the present invention is applicable.
Figure 23:
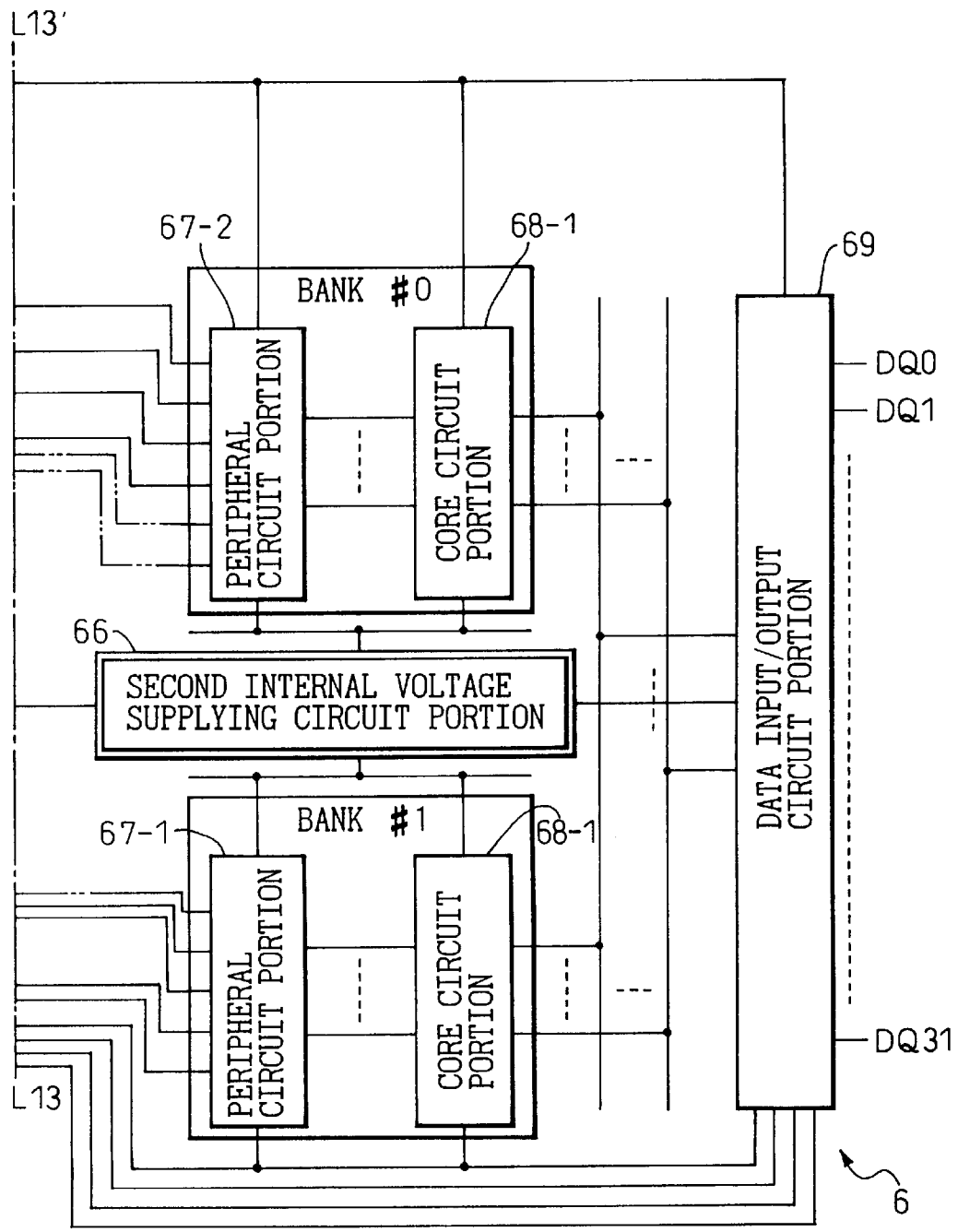
FIG. 23 is a circuit block diagram (No. 2) showing a general configuration of a chip to which a semiconductor integrated circuit according to the present invention is applicable.

FIGS. 22 and 23 are circuit block diagrams 1 and 2, respectively, showing a general configuration of a chip to which the semiconductor integrated circuit according to the present invention is applicable.

The chip 6 shown in FIGS. 22 and 23 is formed with two banks (banks #0, #1). Each bank includes core circuit portions 68-1, 68-2 for selecting a specific one of a plurality of memory cells in a cell array and performing the operation of writing and reading data, and peripheral circuit portions 67-1, 67-2 formed with a peripheral circuit.

The chip 6 is formed on the input side thereof with a first input stage 62 having input lines a00 to a14 for inputting address signals for write and read operations of data, and a second input stage 63 for inputting various control signals (a clock enable signal /CKE, a read enable signal /RE, a chip enable signal /CS, a data write signal /W, a chip select signal /CS and a clock signal CLK, etc.) for the write and read operations of data. Further, a bank decoder 64 and a command decoder 65 are formed for supplying the cell array with a write signal "write", a read signal "read", a power-down signal "pd", a spare signal "pre" and an activation signal "active" for processing the address signals and the control signals and permitting selection of a specific memory cell. Also, the chip 6 is formed on the output side thereof with a data input/output circuit portion 69 for reading data from the memory cell and transferring it to an external means.

Figure 1:
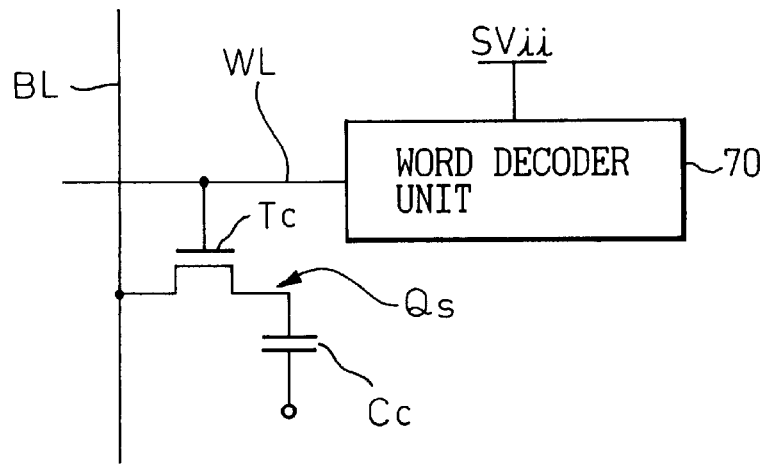
FIG. 1 is a circuit block diagram showing a configuration of a cell transistor of an ordinary DRAM.
Figure 2:
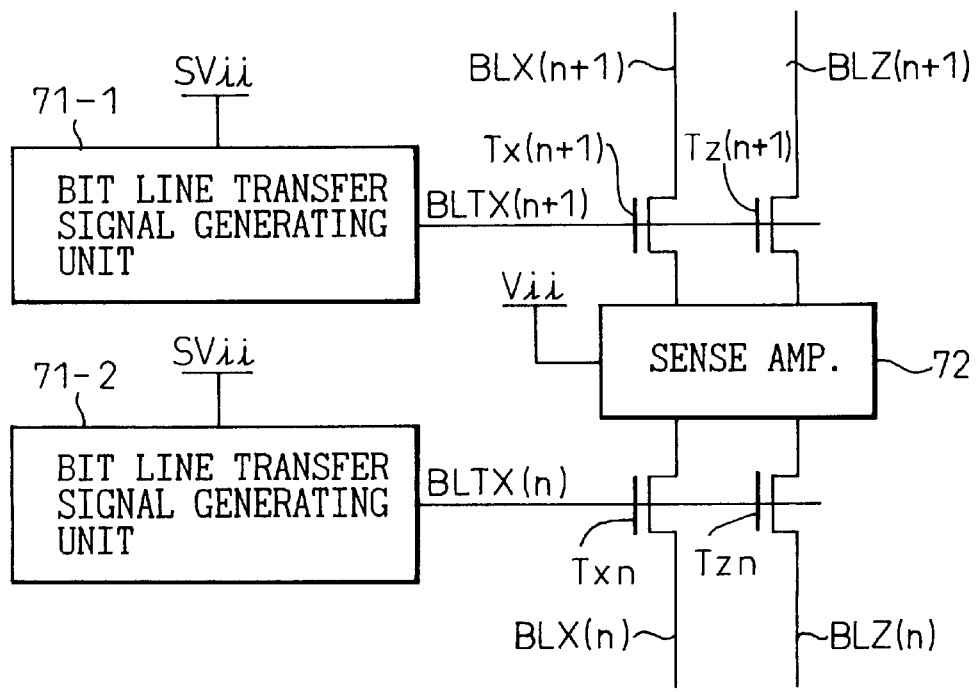
FIG. 2 is a circuit diagram showing a configuration of a bit line transfer transistor of an ordinary DRAM.
Figure 3:
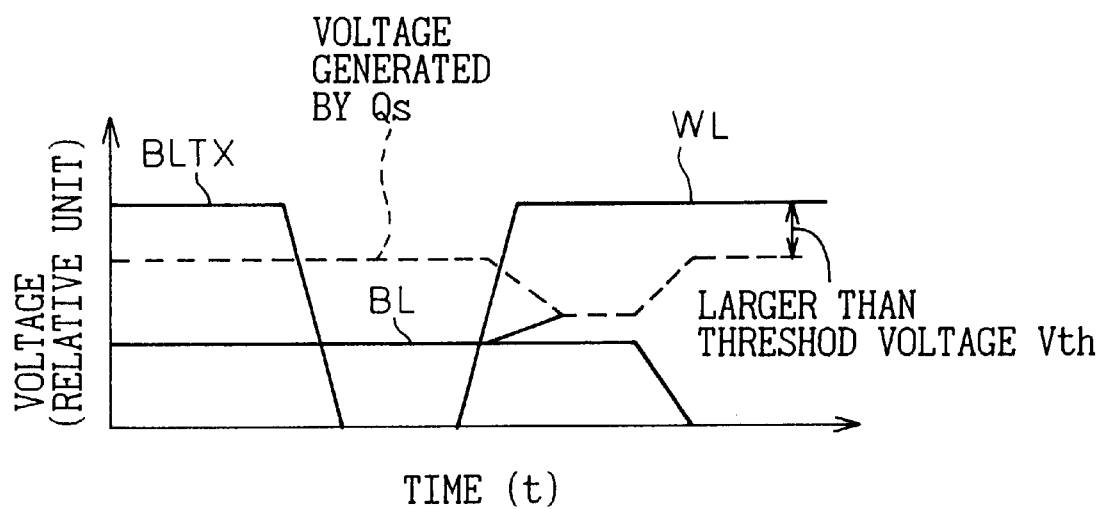
FIG. 3 is a diagram showing an operation voltage waveform for reading the cell data in an ordinary DRAM.

Further, the chip 6 is formed with a step-up voltage generating unit 35 (substantially corresponding to the step-up voltage generating unit 3 of FIG. 3) for supplying a step-up voltage to the gate of the cell transistor in the memory cell and the core circuit portion. The step-up voltage generated by the step-up voltage generating unit 35 is applied to the gate of the cell transistor in the memory cell and the core circuit portion through a first internal voltage supplying circuit portion 60 and a second internal voltage supplying circuit portion 66. Furthermore, the first input stage 62 and the second input stage 63 not requiring any step-up voltage are supplied with a voltage stepped down from the step-up voltage by a voltage step-down unit 61.

The drain voltage-fixing change-over switch portion 2a and the gate voltage-fixing change-over switch portion 2b according to this invention are formed in a very small area in the bank, and therefore the area of the chip 6 is not increased.

It will thus be understood from the foregoing description that, first, in a semiconductor integrated circuit according to a preferred embodiment of the present invention, the input voltage of a precharge portion for precharging a step-up node is clamped to a predetermined level during the period when a burn-in test is conducted, and therefore the voltage level of the step-up node is prevented from excessively increasing at the time of the burn-in test while at the same time realizing the normal operation of a step-up voltage generating unit after starting the burn-in test.

Second, in a semiconductor integrated circuit according to a preferred embodiment of the present invention, the value of the step-up voltage is determined based on the threshold voltage for turning on a plurality of MOS transistors, and therefore the clamping voltage level is set easily and the voltage level of the step-up node can be prevented from excessively increasing almost without failure.

Third, in a semiconductor integrated circuit according to a preferred embodiment of the present invention, the drain voltage of the MOS transistor in the precharge input voltage clamping unit is set to the source voltage level thereof to turn off the MOS transistor in the precharge portion, and therefore the voltage level of the step-up node is prevented from excessively increasing at the time of a burn-in test with a simple circuit configuration, while at the same time realizing the normal operation of the step-up voltage generating unit after starting the burn-in test.

Fourth, in a semiconductor integrated circuit according to a preferred embodiment of the present invention, the gate voltage of the MOS transistor in the precharge input voltage clamping unit is set to a step-up voltage level to permit the MOS transistor in the precharge portion to act as a diode. Therefore, the voltage level of the step-up node is prevented from excessively increasing at the time of a burn-in test with a simple circuit configuration, while at the same time realizing the normal operation of the step-up voltage generating unit after starting the burn-in test.

What is claimed is:

1. A semiconductor integrated circuit including a step-up circuit which receives a power supply voltage and outputs a step-up voltage higher than the power supply voltage at an output node, said step-up circuit comprising;

an NMOS transistor coupled between the power supply voltage and a step-up node, for precharging the step-up node;

a transfer switch coupled between the step-up node and the output node, for supplying the output node with the step-up voltage generated at the step-up node; and a clamp circuit connected to a gate node of said NMOS transistor for clamping the gate node at a clamp voltage which is lower than sum of the power supply voltage and a threshold voltage of the NMOS transistor in response to a test signal.

2. A semiconductor integrated circuit as claimed in claim 1, wherein the step-up voltage is higher than sum of the power supply voltage and the threshold voltage of the NMOS transistor.

3. A semiconductor integrated circuit as claimed in claim 1, wherein the test signal is an active level during a burn-in test.

4. A semiconductor integrated circuit as claimed in claim 1, wherein the clamp voltage is the power supply voltage.

5. A semiconductor integrated circuit as claimed in claim 4, wherein the clamp circuit comprises:

a second NMOS transistor coupled between the power supply voltage and the gate node; and a switch connected with a gate of said second NMOS transistor, for supplying the gate with the power supply voltage or the step-up voltage in response to the test signal.

6. A semiconductor integrated circuit as claimed in claim 1, wherein the clamp voltage is a ground potential.

7. A semiconductor integrated circuit as claimed in claim 6, wherein the clamp circuit comprises:

a second NMOS transistor having a gate which receives the power supply voltage; and a switch supplying the gate node with the power supply voltage or the ground potential via said second NMOS transistor in response to the test signal.

8. A semiconductor integrated circuit as claimed in claim 1, further comprising:

a capacitor having a first end coupled to the gate node and a second end for boosting the gate node; and a switch for supplying the second node with a clock signal;

wherein said switch turns off in response to the test signal.

* * * * *